(12) United States Patent
Ishitani et al.

(10) Patent No.: US 8,847,274 B2
(45) Date of Patent: Sep. 30, 2014

(54) LED DEVICE

(75) Inventors: Kiyoshi Ishitani, Nara (JP); Hiroki Yoshihara, Osaka (JP); Haruki Inaba, Osaka (JP)

(73) Assignees: Nihon Colmo Co., Ltd., Osaka (JP); Panasonic Corporation, Osaka (JP)

( * ) Notice: Subject to any disclaimer, the term of this patent is extended or adjusted under 35 U.S.C. 154(b) by 73 days.

(21) Appl. No.: 13/812,772

(22) PCT Filed: Apr. 9, 2012

(86) PCT No.: PCT/JP2012/059627
§ 371 (c)(1),
(2), (4) Date: Jan. 28, 2013

(87) PCT Pub. No.: WO2013/153591
PCT Pub. Date: Oct. 17, 2013

(65) Prior Publication Data
US 2014/0231819 A1    Aug. 21, 2014

(51) Int. Cl.
*H01L 33/00* (2010.01)
*H01L 33/56* (2010.01)
*H01L 33/32* (2010.01)
*H01L 33/50* (2010.01)

(52) U.S. Cl.
CPC ............. *H01L 33/56* (2013.01); *H01L 33/32* (2013.01); *H01L 33/50* (2013.01)
USPC ............. 257/100; 257/684; 257/788; 438/26; 438/100

(58) Field of Classification Search
CPC ........ H01L 33/52; H01L 33/56; H01L 33/486
USPC ......... 257/100, 678, 684, 688, 787, 788, 789; 438/26, 28, 127
See application file for complete search history.

(56) References Cited

U.S. PATENT DOCUMENTS

| | | | |
|---|---|---|---|
| 6,312,500 | B1 | 11/2001 | Duyvesteyn et al. |
| 7,629,621 | B2 | 12/2009 | Reeh et al. |
| 2011/0298003 | A1* | 12/2011 | Uchida et al. ................. 257/100 |

FOREIGN PATENT DOCUMENTS

JP         61-3438 A       1/1986
(Continued)

OTHER PUBLICATIONS

Patent Abstracts of Japan for JP 08-102553 (Apr. 16, 1996).
(Continued)

*Primary Examiner* — Olik Chaudhuri
*Assistant Examiner* — John M Parker
(74) *Attorney, Agent, or Firm* — Millen, White, Zelano & Branigan, P.C.

(57) ABSTRACT

An LED device is disclosed in which an LED chip is encapsulated in a encapsulant. The LED device includes an LED chip mounted on a support and electrically connected and an encapsulant encapsulating the LED chip, wherein the encapsulant is a transparent amorphous solid made of a metal oxide, and the solid contains as a major component at least one metal oxide selected from the group consisting of $Al_2O_3$, MgO, ZrO, $La_2O_3$, CeO, $Y_2O_3$, $Eu_2O_3$, and ScO.

21 Claims, 2 Drawing Sheets

(56) References Cited

FOREIGN PATENT DOCUMENTS

| | | | |
|---|---|---|---|
| JP | 01-284583 | A | 11/1989 |
| JP | 08-102553 | A | 4/1996 |
| JP | 2927279 | B2 | 5/1999 |
| JP | 11-177129 | A | 7/1999 |
| JP | 3349111 | B2 | 9/2002 |
| JP | 2009-123803 | A | 6/2009 |
| JP | 4394036 | B2 | 10/2009 |
| JP | 2010-248411 | A | 11/2010 |
| JP | 5059251 | B1 | 8/2012 |

OTHER PUBLICATIONS

Patent Abstracts of Japan for JP 11-177129 (Jul. 2, 1999).
Machine Translation for JP 4394036 (Oct. 23, 2009).
Patent Abstracts of Japan for JP 01-284583 (Nov. 15, 1989).
Patent Abstracts of Japan for JP 2010-248411 (Nov. 4, 2010).
Patent Abstracts of Japan for JP 2009-123803 (Jun. 4, 2009).
Patent Abstracts of Japan for JP 61-003438 (Jan. 9, 1986).
Machine Translation for JP 2927279 (May 14, 1999).
Machine Translation for JP 3349111 (Sep. 13, 2002).

* cited by examiner (A)

LED DEVICE

TECHNICAL FIELD

The present invention relates to a light emitting diode (hereinafter referred to as "LED"), in particular to a LED device in which a LED chip is encapsulated in an inorganic encapsulant on a substrate.

BACKGROUND ART

In LED devices, a LED chip is encapsulated in an encapsulant for providing protection from moisture and corrosive gases in the air. Currently, epoxy resins and silicone resins are employed as encapsulant (cf., Patent Documents 1-4, for example).

However, epoxy resins are poorly resistant to light and heat, and prone to change in color, thus posing problems, especially when employed in white LEDs which create white light based on near-ultraviolet to blue LED chips, that is, degradation and change in color over time due to light having the shorter wavelengths and thereby lowering intensity of light achieved. Degradation of epoxy resins is caused mainly by degeneration of the resins' own organic functional groups, and it is thought that the degradation is accelerated by catalysts and curing accelerators contained in the resins, as well as by unreacted functional groups remaining in the resins. Therefore, attempts have been made to change the types of the monomers employed in forming epoxy resins from those having aromatic rings, which are said to be prone to cause color changes, to those having aliphatic rings, which are free of such risks. However, no epoxy resins with a satisfying performance have been obtained so far.

Silicone resins, on the other hand, are superior in heat resistance and light resistance. However, they have high permeability to water vapor, and thus are incapable of guarding LED chips and phosphors from moisture, and they also have problems that they, owing to their poor adhesiveness, entail risks of their becoming detached from chip surfaces.

Furthermore, refractive indexes of resins are low as compared with those of semiconductors which form LED chips, and there is a great difference in refractive index between them. For example, where a GaN-based LED chip is encapsulated in a silicone resin, the difference in refractive index between GaN (2.3 to 2.4) and a silicone resin (refractive index: 1.4) is as much as about 0.9 to 1.0. The greater is the difference in refractive index between a LED chip and its encapsulant, the smaller the critical angle of total internal reflection becomes at the interface between the LED chip and the encapsulant. This results in more of the incident light arriving at the interface from the LED chip side at angles greater than the critical angle and thus being totally reflected, which leads to lowered output efficiency of light due to its repeated reflection within the LED chip accompanied by increased absorption within the chip. Moreover, such an increased absorption of light causes a problem of increased heating of the LED chip, which leads to unnecessary rise of the chip's temperature.

A white LED device is generally constructed in a way in which particles of multiple inorganic phosphors are dispersed in the encapsulant, which also serves as a pathway to transmit the light emitted from the LED chip, and a white light source is to realized as a whole by mixing colors of fluorescent light emitted from the particles excited by the light from the LED chip, or by further mixing it with the original light from the LED chip. A number of such inorganic phosphors are known based on, e.g., oxide-based, nitride-based, oxide/nitride-based, sulfide-based phosphors or so on. Among them, sulfide-based phosphors, such as (Ca, Sr)S:Eu, $CaGa_2S_4$:Eu, ZnS:Cu,Al, and the like, have high potential capacity of being utilized as phosphors to provide superior white light sources, for many of them efficiently emit vivid light when excited by blue light. However, phosphors based on sulfide and silicate, in particular sulfide-based phosphors, are hygroscopic and have a drawback that they easily degenerate by moisture. The resins mentioned above have only insufficient moisture resistance to maintain the stability of sulfide- or silicate-based phosphors added to them, and silicone resins are particularly inadequate because of their especially high permeability to water vapor. Therefore, resin-based encapsulants have the shortcoming that sulfide- and silicate-based phosphors cannot effectively utilized with them.

On the other hand, in order to avoid the problem of changing in color of encapsulant, it is known to employ, instead of epoxy resins, transparent low melting point glass as an encapsulant, whose melting point is adjusted to 130 to 350° C. by addition of selenium, thallium, arsenic, sulfur and the like (Patent Document 5). It is also known to encapsulate a LED chip in lead glass as a low melting point glass, whose melting point is at about 400° C. (Patent Document 6). It is also known to encapsulate a substrate on which a LED chip is mounted in a low melting point flat glass layer based on $B_2O_3$—$SiO_2$—ZnO—$Bi_2O_3$—$La_2O_3$ or $B_2O_3$—$SiO_2$—ZnO—$Bi_2O_3$—$Nb_2O_3$, by hot pressing (Patent Document 7). In this case, the deformation point of the low melting point glass is in the range of 475-534° C. according to the working examples presented there.

However, in order to melt the aforementioned low melting point glass, though they are claimed to have low melting points, must be heated at least to 130-350° C. or around 400° C. (Patent Document 5 or 6), or at least 475-534° C., which poses an unnegligible risk of thermal damages to the chips and the underlying substrates.

Thus, there has been a potential need for a transparent encapsulant which is stable against light and heat, highly moisture resistant and thereby substantially blocks moisture permeation, and yet can provide encapsulation even by heating at lower temperatures than conventional low melting point glass. Further, when used in direct contact with the surface of the semiconductor of which a LED chip is formed, an encapsulant having the higher refractive index is desired so as to reduce the difference between it and the refractive index of the semiconductor forming the chip.

PRIOR ART DOCUMENTS

Patent Documents

Patent Document 1: Japanese Patent No. 2927279
Patent Document 2: Japanese Patent No. 3349111
Patent Document 3: U.S. Pat. No. 6,312,500
Patent Document 4: U.S. Pat. No. 7,629,621
Patent Document 5: Japanese Patent Application Publication No. H08-102553
Patent Document 6: Japanese Patent Application Publication No. H11-177129
Patent Document 7: Japanese Patent No. 4394036

SUMMARY OF INVENTION

Problem to be Solved by the Invention

Against the above-mentioned background, an objective of the present invention is to provide a LED device in which encapsulation is provided using an encapsulant which is highly moisture resistant and substantially impermeable to moisture, stable against light and heat, and yet can provide encapsulation even by heating at lower temperatures than conventional low melting point glass.

Means to Solve the Problem

Against the above-mentioned background, an objective of the present invention is to provide a LED device in which encapsulation is provided using an encapsulant which has greater moisture resistance than epoxy resins or silicone resins and substantially blocks moisture permeation, excels in light resistance and heat resistance, and yet can provide encapsulation even by heating at relatively low temperatures.

The present inventors discovered that the above-mentioned objectives can be achieved by employing, as an encapsulant, a transparent amorphous solid comprising a metal oxide which is obtained by inducing thermal decomposition and polymerization of particular organometallic compounds, and through further studies, completed the present invention. Thus the present invention provides what follows.

1. A chip-encapsulated LED device comprising an LED chip which is mounted on a support and electrically connected and an encapsulant encapsulating the LED chip, wherein the encapsulant is a transparent amorphous solid comprising a metal oxide, wherein the amorphous solid comprises, as the major component, at least one metal oxide selected from the group consisting of $Al_2O_3$, $MgO$, $ZrO$, $La_2O_3$, $CeO$, $Y_2O_3$, $Eu_2O_3$, and $ScO$.

2. The chip-encapsulated LED device according to 1 above, wherein the major component of the amorphous solid is ZrO.

3. The chip-encapsulated LED device according to 1 or 2 above, wherein the amorphous solid further comprises $SiO_2$ as a component.

4. The chip-encapsulated LED device according to one of 1 to 3 above, wherein the encapsulant encapsulates the LED chip adhering directly to the surface thereof.

5. The chip-encapsulated LED device according to one of 1 to 4 above, wherein the LED chip is indirectly encapsulated in the encapsulant in which the LED chip already encapsulated in other encapsulant is encapsulated.

6. The chip-encapsulated LED device according to one of 1 to 5 above, wherein the encapsulant contains particles of one or more inorganic phosphors dispersed therein.

7. The chip-encapsulated LED device according to one of 1 to 5 above, wherein the encapsulant comprises two layers consisting of a layer which is closer to the LED chip and a layer which is farther from the LED chip, wherein at least one of the two layers contains particles of one or more inorganic phosphors dispersed therein.

8. The chip-encapsulated LED device according to 6 or 7 above, wherein the particles of one or more inorganic phosphors comprise at least particles of a sulfide-based phosphor or particles of a silicate-based phosphor.

9. The chip-encapsulated LED device according to one of 1 to 8 above, wherein the LED chip is a gallium nitride-based LED chip.

10. A method of production of a LED device in which an LED chip is encapsulated in a transparent amorphous solid comprising a metal oxide, comprising providing a LED chip mounted on a substrate and electrically connected, applying a solution comprising a metal alkoxide to the chip to cover the chip and an adjacent area thereto with the solution, subjecting the solution to a heat treatment to convert the solution to a transparent amorphous solid, wherein the amorphous solid comprises, as the major component, at least one metal oxide selected from the group consisting of $Al_2O_3$, $MgO$, $ZrO$, $La_2O_3$, $CeO$, $Y_2O_3$, $Eu_2O_3$, and $ScO$.

11. The method of production according to 10 above, wherein the metal alkoxide is represented by the formula $M(OR_1)_n$ (wherein M denotes a metal atom selected from the group consisting of Al, Mg, Zr, La, Ce, Y, Eu, and Sc; n denotes the valence of M, and R1 denotes an alkyl group having 1-6 carbon atoms).

12. The method of production according to 11 above, wherein M is Zr.

13. The method of production according to one of 10 to 12 above, wherein the solution comprising a metal alkoxide contains an organic solvent.

14. The method of production according to one of 10 to 13 above, wherein the solution comprising a metal alkoxide contains an alkoxysilane represented by the formula $Si(OR_2)_4$ (wherein $R_2$ denotes an alkyl group having 1-5 carbon atoms).

15. The method of production according to one of 10 to 14 above, wherein the solution comprising a metal alkoxide contains silica particles having a mean particle size of less than 10 nm.

16. The method for production according to one of 10 to 15 above, wherein the heat treatment is carried out at 70 to 200° C. for 0.25 to 4 hours.

17. The method of production according to one of 10 to 16 above, wherein the solution comprising a metal alkoxide is applied directly to the surface of the chip.

18. The method of production according to one of 10 to 17 above, wherein the LED chip is encapsulated in advance in other encapsulant, and wherein the solution comprising a metal alkoxide is applied to this other encapsulant.

19. The method of production according to one of 10 to 18 above, wherein the solution comprising a metal alkoxide contains dispersed particles of one or more inorganic phosphors.

20. The method of production according to one of 10 to 19 above, wherein a process of application of the solution comprising a metal alkoxide and heat treatment thereof is performed at least two times, wherein in at least in one performance of the process, the solution comprising a metal alkoxide contains dispersed particles of one or more inorganic phosphors.

21. The method of production according to one of 10 to 20 above, wherein the LED chip is a gallium nitride-based LED chip.

Advantageous Effect of the Invention

The present invention enables provision of LED chips encapsulated in a transparent amorphous solid which is highly moisture resistant and substantially impermeable to moisture, and stable against light and heat since it comprises a metal oxide. Therefore, in LED devices provided according to the present invention, LED chips are infallibly protected from moisture, and even sulfide-based and silicate-based inorganic phosphors, which are prone to degenerate by moisture and therefore were difficult to be utilized, can now be stably used, dispersed in the encapsulant. Thus, the present invention eliminates the conventional restrictions in choosing inorganic phosphors, thereby enabling free selection and employment of inorganic phosphors as desired.

Further, the encapsulant employed in the present invention enables prevention of risks of adverse effects on the chips and the substrate, such as heat damages, because it, after applied in the form of its solution to the LED chips, also enables encapsulation with it to be performed by heat treatment at lower range of temperatures than conventional low melting point glass.

Furthermore, a transparent amorphous solid comprising a metal oxide as the major component readily provides higher refractive indexes than those of resins. Therefore, if a LED chip is encapsulated in it by its direct application to the surface of the chip (to the surface of the semiconductor), the critical angle of total internal reflection at the interface is thereby enlarged, which then not only increases output efficiency of light but thereby reduces absorption of light within the LED chip, thus providing additional advantage of prevention of excessive heating of the LED chip.

DESCRIPTION OF EMBODIMENTS

In the present invention, the term "major component", when used in relation to a transparent amorphous solid comprising metal oxide, means a component whose content is not smaller than the content (wt %) of any other components constituting the amorphous solid (the dispersion medium which keeps particles of inorganic phosphors suspended in it, if contained), more preferably not less than twice, still preferably not less than thrice, and particularly preferably not less than four times the content of such other components.

Further, in the present invention, the term "transparent", when used in relation to an amorphous solid comprising metal oxide, refers to the amorphous solid itself, and to the very amorphous solid serving as the suspension medium that keeps particles of phosphors dispersed in it, if the amorphous solid contains dispersed particles of phosphors.

In the metal alkoxide [$M(OR_1)_n$], the raw material for the encapsulant in the present invention, R denotes an alkyl group having 1-6 carbon atoms, preferably an alkyl group having 1-5 carbon atoms, more preferably an alkyl group having 1-4 carbon atoms, and particularly preferably an alkyl group having 1-3 carbon atoms. Examples of particularly preferred alkyl group include methyl, ethyl, propyl, isopropyl. The metal M is preferably selected from Al, Mg, Zr, La, Ce, Y, Eu, and Sc. Though Zr and Al are preferred among them, and particularly Zr, M is not limited to them. Besides, the term "alkyl group", when used in relation to $R_1$, includes cycloalkyl group.

In the present invention, a metal alkoxide may be applied, in the form of a solution containing it, (either directly or over an already formed encapsulant) to an LED chip. A solvent in which a metal alkoxide is to be dissolved may be chosen and employed, as desired, from such a type of organic solvent that can dissolve a raw material metal alkoxide, causes no useless reaction with the metal alkoxide, and can be evaporated by heat treatment. Examples of preferred organic solvent include, but are not limited to, glycol ether type organic solvent, such as ethylene glycol monobutyl ether, and diethylene glycol monobutyl ether, in particular those having 6-8 carbon atoms; carbohydrates, in particular aromatic organic solvents, such as benzene, toluene, and xylene; alcoholic organic solvents such as methanol, ethanol, n-propanol, isopropanol, n-butanol, sec-butanol, and tert-butanol, in particular those having 1-6 carbon atoms.

In the present invention, the term a "solution comprising a metal oxide" includes not only a solution in which a metal alkoxide is simply dissolved, but a mixture in which decomposition and polymerization of the metal alkoxide in the solvent has partly proceeded, so long as it is in a state of solution. A solution containing such a partial polymer can also be used, likewise to a metal alkoxide solution which is free of such a partial polymer, to encapsulate LED chips. In some cases, a solution of such a partially polymerized metal alkoxide is more easy to handle in the process of encapsulation because it has an increased viscosity compared with the solution before polymerization, and it also serves to some degree to shorten the time needed for curing, for it is already partly polymerized. As decomposition and polymerization of metal alkoxide is catalyzed either by acid or a base, it is possible to accelerate decomposition and polymerization of the metal alkoxide by adding, to the solution comprising the metal alkoxide, a lower aliphatic acid, such as acetic acid or the like (particularly those having not more than 8 carbon atoms) or an inorganic acid, such as hydrochloric acid or the like, in a small amount (e.g., not more than 0.03 mole and more preferably not more than 0.02 mole, per 1 mole of a metal alkoxide).

A metal alkoxide may be dissolved in a liquid state tetraalkoxysilane $Si(OR_2)_4$ [wherein $R_2$ denotes an alkyl group having 1-5 carbon atoms]. In the presence of tetraalkoxysilane, decomposition and polymerization of a metal alkoxide can be allowed to proceed at lower temperatures. Particularly preferred examples of liquid state tetraalkoxysilane include tetramethoxysilane, tetraethoxysilane, tetra-n-propoxysilane, and tetraisopropoxysilane. Besides, the term "alkyl group", when used as for $R_2$, includes cycloalkyl groups.

When employing a liquid state tetraalkoxysilane as a solvent to prepare a solution of metal alkoxide, an organic solvent is not necessary, but may be used. When forming an encapsulant using a metal alkoxide and tetraalkoxysilane, the amount of each compounds used is adjusted so that the amount of metal oxide units generated by decomposition of the metal alkoxide will be not less than equivalent to, and preferably not less than 2 times, more preferably not less than 3 times, and particularly preferably not less than 4 times the amount of the $SiO_2$ units generated by decomposition of tetraalkoxysilane.

Further, a small amount of a higher fatty acid (particularly those having 12-20 carbon atoms), such as stearic acid, may be added in order to increase the viscosity of the solution comprising a metal alkoxide. In that case, the amount of the higher fatty acid added is preferably not more than 10 wt %, more preferably not more than 8 wt %, and still more preferably not more than 6 wt %, relative to the weight amount of the metal alkoxide (and tetraalkoxysilane, if contained) in the solution.

When preparing a metal alkoxide solution, it is allowed to add a chelating agent such as ethyl 3-oxobutanoic acid (ethyl acetoacetate) to the metal alkoxide. Further, it is also possible to add water and a catalyst, such as an acid, to a metal alkoxide in order to let the metal alkoxide decompose by way of hydrolysis, thereby partly bringing about hydrolysis and dehydration-condensation of the metal alkoxide. The amount of water to be added may be set as desired, but it is preferably not more than 1.5 mole, more preferably not more than 1.2 mole, and still more preferably not more than 1 mole, per 1 mole of the metal alkoxide. As water can be evaporated under reduced pressure, it is allowed to use a bigger amount of water (but of no practical use). Besides, the species and the amount of acid that can be added for hydrolysis are as mentioned above. The partial polymer thus produced may, after made into a viscose liquid (sol) by removing water by evaporation under reduced pressure, be used, directly or after diluted with an organic solvent and/or tetraalkoxysilane as desired, to perform encapsulation.

Besides, it is also allowed to add silica particles having a mean particle size of less than 10 nm (single-nano silica particles) to the solution of a metal alkoxide. In this case, too, the amount of each components used is adjusted so that the amount of metal oxide units generated by heat decomposition of the metal alkoxide (and of a tetraalkoxysilane depending on the case) will be not less than equivalent to, and preferably not less than 2 times, more preferably no less than 3 times, and particularly preferably no less than 4 times the amount of the single-nano silica particles used (and of $SiO_2$ units generated by decomposition of a tetraalkoxysilane, if employed).

In the present invention, the heat treatment of the metal alkoxide solution applied to the LED chip is performed preferably at 70-200° C., more preferably at 80-150° C., and particularly preferably at 90-120° C. The duration of heating is preferably 0.25-4 hours, more preferably 0.25-2 hours, and particularly preferably 0.25-1 hour.

As the characteristic properties of the present invention are derived from the encapsulant's own excellent properties (heat resistance, light resistance, moisture resistance, ability of forming at relatively low temperatures, and the like), there is no restriction as to types of the objects, LED chips, to which the encapsulant is applied. Therefore, the present encapsulant may be equally applied to various LED chips which are made of some or other semiconductors. LED chips based on gallium nitride (GaN) are widely used, and present a particularly preferred example of LED chips to be chosen in the present invention. There are known GaN-based LED chips of a variety of layer structures based on GaN as the basic material which is doped with various elements. Any of them may be equally used in the present invention.

Further, in the present invention, the encapsulant which is a transparent amorphous solid comprising a metal oxide may be applied either directly to the surface of the semiconductor which forms the LED chip, or to other encapsulant in which the LED chip is already encapsulated, thus indirectly encapsulating the LED chip. Metal oxides employed in the present invention are materials whose crystals inherently exhibit greater refractive indexes than those of epoxy resins or silicone resins, namely, $Al_2O_3$ (1.76), MgO (1.72), ZrO (2.40), $La_2O_3$ (1.88), CeO (2.2), $Y_2O_3$ (1.82), $Eu_2O_3$ (1.98), and ScO (1.96). Thus, increased refractive indexes are easily achieved with them, even in the form of amorphous solid. Therefore, if the surface of a LED chip (surface of the semiconductor) is directly encapsulated in the amorphous solid made of them, reduced difference in refractive index between the LED chip and the encapsulant is realized, as compared with the case where the LED chip is encapsulated in resin-based encapsulants, which results in enlarged critical angle and thus reduction of the proportion of light with which total internal reflection takes place. This reduces or eliminates repeated reflection of light within the LED chip, thereby increasing the output efficiency of light as well as serving to suppress temperature rise inside the LED chip.

For example, in applying an encapsulant which is a transparent amorphous solid comprising a metal oxide directly to the surface of an LED chip (the surface of the semiconductor), if the LED is mounted in a reflector defining a reflective recess, the encapsulant may be poured into the reflector and then heat treated. Further, the encapsulant may be applied by hot press in the form of a sheet covering a LED chip on a support. Furthermore, in order to encapsulate a LED chip in a generally hemispheric dome-shaped encapsulant with the chip placed in the center, the encapsulant may be applied by hot press using a corresponding mold. Where the encapsulant is formed into a dome-shape with an LED chip placed in the center, emitted light is to reach the interface between the encapsulant and the outer environment at small incident angles, thus nearly none of the light exceeding the critical angle of total internal reflection at the site. In consequence, a still increased output efficiency of light is achieved compared with the case where the encapsulant is formed to have a flat surface.

An encapsulant may contain dispersed particles of inorganic phosphors. For this, particles of inorganic phosphors may be dispersed in the raw material solution (metal alkoxide solution) of the encapsulant employed. As it is an amorphous solid comprising a metal oxide, the encapsulant used in the present invention is highly stable and substantially impermeable to moisture. Therefore, it enables selection and use of various known inorganic phosphors without particular restrictions, even enabling use, especially, of sulfide-based and silicate-based phosphors. Examples of sulfide-based phosphors include such sulfide-based phosphors as (Sr, Ca)S:Eu, ZnS:Cu, Al and the like; and thiogallate-based phosphors such as $CaGa_2S_4$:Eu, $SrGa_2S_4$:Eu and the like. Examples of silicate-based phosphors, which belong to oxide-based phosphors, include (Ba, Sr)$_2SiO_4$:Eu (BOS), (Ba,Sr)$_3SiO_5$:Eu, $Ca_8Mg(SiO_4)_4Cl_2$:Eu, $Ca_3Sc_2Si_3O_{12}$:Ce and the like. Examples of other phosphors include aluminate-based phosphors, which also belong to oxide-based phosphors, such as (Y, Gd)$_3$(Al, Ga)$_5O_{12}$:Ce (YAG), $SrAl_2O_4$:Eu, $BaMgAl_{10}O_{17}$:Eu and the like; nitride-based phosphors such as (Ca, Sr)$_2Si_5N_8$:Eu, (Ca, Sr)AlSiN$_3$:Eu, $CaSiN_2$:Eu and the like; oxynitride-based phosphors such as Cax(Si, Al)$_{12}$(O, N)$_{16}$:Eu, (Si, Al)$_6$(O, N)$_8$:Eu, $BaSi_2O_2N_2$:Eu and the like; oxysulfide-based phosphors such as $Y_2O_2S$:Eu, $Gd_2O_2S$:Eu, $La_2O_2S$:Eu and the like; and in addition, 3.5 MgO/0.5 MgF$_2$/GeO$_2$:Mn, $K_2SiF_6$:Mn and the like.

Further, an encapsulant may be provided in the form of multiple layers. If an encapsulant comprises two layers, for example, one is closer to a LED chip than the other, particles of inorganic phosphors may, as desired, be added to one of the two layers only (e.g., only to the layer nearer to the LED chip, or only to the layer farther from the LED chip).

EXAMPLES

Though the present invention will be described in further detail below with reference to examples, it is not intended that the present invention be limited to those examples.

1. Gallium Nitride (GaN)-Based LED Chip

In the experiment described below, GaN-based LED chips of the following characteristics were used.

Size: 1 mm×1 mm

Layer structure: substrate/buffer layer/n-layer/light emitting layer/p-layer (p and n terminals contacting with respective p/n)

[Basic Performance]
Peak wavelength: 450 nm
Power of light emission (per 1 W): 430 mW (3.1 v, 320 mA)
[Structure of the Device]

Two-wire GaN-based LED chips were each mounted in a lead frame-type resin package board and connected to the circuit. The LED chips were encapsulated by applying to them one of raw materials described in the following examples and heat treating it to form a transparent amorphous solid. While Examples 1-5 below set forth embodiments in which encapsulation is provided in the form of a flat layer, encapsulation may also be provided in the form of a dome, in which case a dome-shaped preform prepared in advance may be hot pressed (by heating to about 100° C. in a mold) to provide encapsulation in the form of a dome.

Example 1

Figure 1:
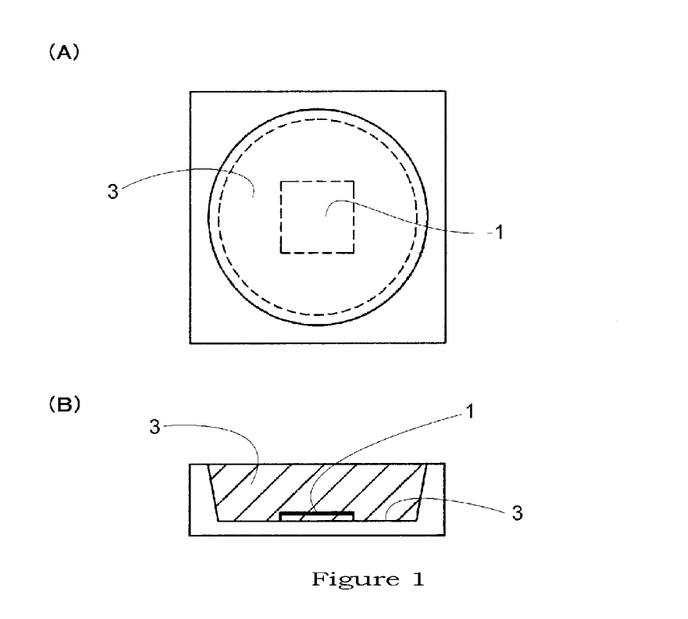
FIG. 1 shows a plan view (a) of a LED frame on which a LED chip is mounted, and (b) a side cross-sectional view thereof.

Eight parts by weight of a powder of zirconium-based alkoxide metal complex, $[Zr(O-i-C_3H_7)_4]$, were dissolved in 2 parts by weight of tetraethoxysilane. In this solution thus obtained were dispersed silicate-based phosphors, $Ca_8Mg(SiO_4)_4Cl_2$:Eu and $(Sr, Ba)_3SiO_5$:Eu in an amount of 0.3 part by weight and 0.7 part by weight, respectively, per amorphous solid to prepare the a raw material composition for forming an encapsulant made of a transparent inorganic metal compound containing dispersed phosphors. An LED chip 1 was mounted in a lead frame-type resin package board and electrically connected. The reflector 2 of the frame then was filled with the raw material composition 3 (FIG. 1). Encapsulation was achieved by heat treatment in the air at 100° C. for 2 hours, together with the substrate. The mean particle size of the phosphors was about 15 μm, and the thickness of the encapsulant layer was about 500-600 μm. A LED device was thus provided by forming a color converting layer. In the LED device, the weight ratio of $ZrO/SiO_2$ is 4.5/1, and the molar ratio is 2.6/1.

Example 2

Eight parts by weight of a powder of zirconium-based alkoxide metal complex, $[Zr(O-i-C_3H_7)_4]$, and 0.5 part by weight of a powder of stearic acid were dissolved in 1.5 parts by weight of tetraethoxysilane. In this solution thus obtained were dispersed the same silicate-based phosphors at the same proportions as in Example 1 to prepare a raw material composition for forming an encapsulant made of a transparent inorganic metal compound containing dispersed phosphors. As in Example 1, this raw material composition was poured into a LED frame with a mounted and connected LED chip, and encapsulation was achieved by heat treatment at 100° C. in the air for 2 hours. The mean particle size of the phosphors was about 15 μm, and the thickness of the layer of encapsulant was about 500-600 μm. A LED device was provided by thus forming a color converting layer.

Example 3

Eight parts by weight of a powder of zirconium-based alkoxide metal complex, $[Zr(O-i-C_3H_7)_4]$, and diethylene glycol mono-n-butyl ether $[CH_3(CH_2)_3OCH_2CH_2-OCH_2CH_2OH]$ (2 parts by weight per zirconium-based alkoxide complex) were dissolved in 2 parts by weight of tetraethoxysilane. In this solution thus obtained were dispersed the same silicate-based phosphors at the same proportions as in Example 1 to prepare a raw material composition for forming an encapsulant made of a transparent inorganic metal compound containing dispersed phosphors. As in Example 1, this raw material composition was poured into a LED frame with a mounted and connected LED chip, and encapsulation was achieved by heat treatment at 100° C. in the air for 2 hours. The mean particle size of the phosphors was about 15 μm, and the thickness of the layer of encapsulant was about 500-600 pm. A LED device was provided by thus forming a color converting layer.

Example 4

Eight parts by weight of a powder of zirconium-based alkoxide metal complex, $[Zr(O-i-C_3H_7)_4]$, were dissolved in 2 parts by weight of tetraethoxysilane. In this solution thus obtained were dispersed the same silicate-based phosphors at the same proportions as in Example 1 to prepare a raw material composition for forming a encapsulant made of a transparent inorganic metal compound containing dispersed phosphors. As in Example 1, this raw material composition was poured into a LED frame with a mounted and connected LED chip, and encapsulation was achieved by heat treatment at 100° C. in the air for 2 hours. The mean particle size of the phosphors was about 12 μm, and the thickness of the layer of encapsulant was about 200-300 μm. A covering layer of a silicone resin was formed over the thus formed color converting layer to provide a LED device.

Example 5

Eight parts by weight of a powder of zirconium-based alkoxide metal complex, $[Zr(O-i-C_3H_7)_4]$, were dissolved in 2 parts by weight of a nano-silica-based inorganic binder (a mixture of 80 wt % of silica fine particles having a mean particle size of less than 10 nm and 20 wt % of diethylene glycol monobutyl ether). In this mixture thus obtained were dispersed the same silicate-based phosphors at the same proportions as in Example 1 to form a raw material composition for forming a encapsulant made of a transparent inorganic metal compound containing dispersed phosphors. As in Example 1, this raw material composition was poured into a LED frame with a mounted and connected LED chip, and encapsulation was achieved by heat treatment at 100° C. for 2 hours. The particle size of the phosphors was about 15 μm, and the thickness of the layer of encapsulant was about 200-300 μm. A covering layer of a silicone resin was formed over the thus formed color converting layer to provide a LED device.

Comparative Example 1

In a silicone resin (KER-2600: mfd. by Shin-Etsu Silicone) were dispersed the same silicate-based phosphors at the same proportions as in Example 1 to prepare a raw material composition for forming an encapsulant. As in Example 1, this raw material composition was poured into a LED frame with a mounted and connected LED chip, and encapsulation was achieved by heat treatment at 100° C. for 1 hour, and then at 150° C. for further 3 hours to cure the resin to provide a LED device.

2. Comparison of Performance

The LED devices of Examples 1-4 and Comparative Example were placed in an atmosphere at 85° C. and 85% relative humidity for the respective length of time specified in Table 1, and they were let emit under the same driving condition (current: 350 mA) to compare the amount of emitted light with each other. For measurement of the amount of light, spectroradiometer SR-3A (Topcon) was used. The initial amount of light (0 hour) for each LED device was set at 100, and the value of the light amount relative to it, after passage of each specified length of time, is shown in Table 1.
[Table 1]

TABLE 1

Comparison of light amount emitted from each LED device

| Time passed | Comparative Example 1 Silicone | Example 1 ZrO + SiO$_2$ | Example 2 ZrO + SiO$_2$ + StAc | Example 3 ZrO + SiO$_2$ + DGMB | Example 4 Silicone/ ZrO + SiO$_2$ |
|---|---|---|---|---|---|
| 0 hour | 100 | 100 | 100 | 100 | 100 |
| 100 hours | 68 | 97 | 86 | 105 | 105 |
| 200 hours | 63 | 105 | 86 | 106 | 107 |
| 300 hours | 60 | 106 | 85 | 110 | 107 |
| 400 hours | 62 | 108 | 95 | 100 | 107 |
| 500 hours | 53 | 107 | 91 | 98 | 105 |
| 700 hours | 44 | 95 | 90 | 102 | 105 |
| 800 hours | 40 | 93 | 87 | 100 | 105 |
| Evaluation | X | ○ | ○ | ◎ | ◎ |

StAc: Stearic acid, DGMB: diethylene glycol mono-n-butyl ether

As evident in Table 1, while Comparative Example 1, in which an encapsulant consisting of a silicone resin was used, showed reduction of the amount of light down to 60% levels after passage of 100 hours in the high humidity atmosphere, while no substantial reduction in the amount of light was observed in Examples 1-4, indicating the excellent moisture resistance of the encapsulant according to the present invention.

Example 6

Preparation of Solution Containing Partially Polymerized Zirconium Alkoxide

To tetra-n-propoxyzirconium was added 1.5 parts by mole of ethyl 3-oxobutanoic acid (ethyl acetoacetate) and mixed. To this mixture, after generation of heat had ceased, were added 0.01 part by mole of hydrochloric acid, 1 part by mole of water, and 4 parts by mole of ethanol, and partial hydrolysis was allowed to proceed while stirring at room temperature for 1 hour. The mixture thus prepared was concentrated under reduced pressure in a rotary evaporator at 60° C. to give a viscous liquid, which was designated a zirconium alkoxide-containing solution.

Example 7

One part by weight of the zirconium alkoxide-containing solution obtained in Example 6 was diluted by addition of 8 parts by weight of propanol/butanol mixture solution (1/1) to it to prepare a zirconium alkoxide-containing solution.

Example 8

To tetraisopropoxyzirconium was added 1 part by mole of ethyl 3-oxobutanoic acid and mixed. This mixture, after generation of heat had ceased, was added dropwise to a mixture liquid of 0.01 part by mole of hydrochloric acid, 1 part by mole of water, and 4 parts by mole of ethanol, over 1 hour while stirring at room temperature to let partial hydrolysis proceed. The mixture thus prepared was concentrated under reduced pressure in a rotary evaporator at 60° C. to give a viscous liquid, which was a solution containing zirconium alkoxide. To this was added an equivalent amount of isopropanol and mixed to prepare a zirconium alkoxide-containing solution.

Example 9

To tetraisopropoxyzirconium was added 0.6 part by mole of ethyl 3-oxobutanoic acid and mixed. To this mixture, after generation of heat had ceased, were added dropwise a mixture liquid of 0.01 part by mole of hydrochloric acid, 1 part by mole of water, and 4 parts by mole of ethanol, over 1 hour while stirring at room temperature to let partial hydrolysis proceed. The mixture thus prepared was concentrated under reduced pressure in a rotary evaporator at 60° C. to give a viscous liquid, which was a solution containing zirconium alkoxide. This was designated a zirconium alkoxide-containing solution.

Example 10

Figure 2:
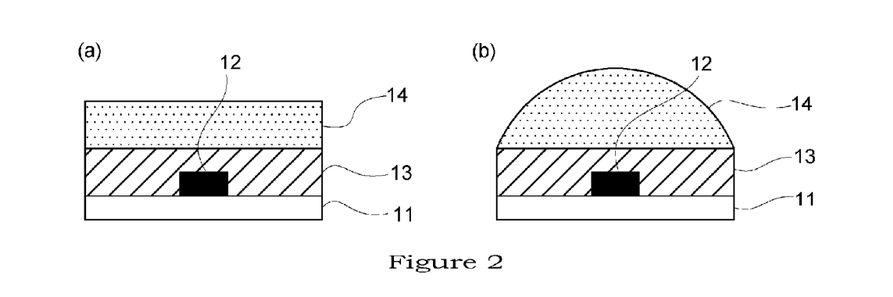
FIG. 2 shows schematic side views of embodiments of the LED devices of Example 10, illustrating LED devices having (a) two plane layers of encapsulant, and (b) two layers, one plane and the other dome-shaped, of encapsulant, respectively.

FIG. 2 is shows schematic side views of an embodiment of the LED device according to the present invention. This embodiment has two encapsulant layers 13 and 14 encapsulating the LED chip 12 on the substrate 11. The encapsulant layer 13 is a light guiding layer of a transparent amorphous solid comprising an oxide of a metal such as Zr according to the present invention, and the encapsulant layer 14 is a color converting layer, which is a layer of a same or similar amorphous solid containing dispersed particles of one or more phosphors. In FIG. 2(a), both layer are provided in a plane form, and in (b) the encapsulant layer 13 is provided in a plane form, and the encapsulant layer 14 in a dome-shape, respectively. However, depending on intended applications, both of the encapsulant layers 13 and 14 may be provided as light guiding layers containing no phosphor particles, or it is also possible, as desired, to provide the encapsulant layer 13 as a color converting layer, and the encapsulant layer 14 as a light guiding layer.

Example 11

Figure 3:
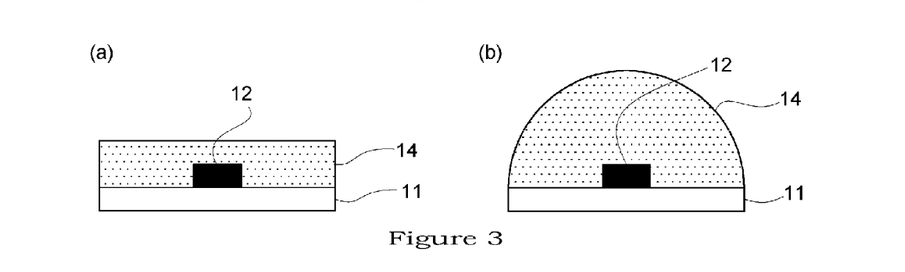
FIG. 3 shows schematic side views of embodiments of the LED devices of Example 11, illustrating LED devices having (a) a single plane layer of encapsulant, and (b) a dome-shaped single layer of encapsulant, respectively.

FIG. 3 is shows schematic side views of another embodiment of the LED device according to the present invention. This embodiment has a single (a) plane or (b) dome-shaped encapsulant layer 14 encapsulating an LED chip 12 on the substrate 11. In this embodiment, the encapsulant layer 14 is a color converting layer. However, it is also possible, as desired, to provide the encapsulant layer 14 as a light guiding layer containing no phosphor particles.

Example 12

Figure 4:
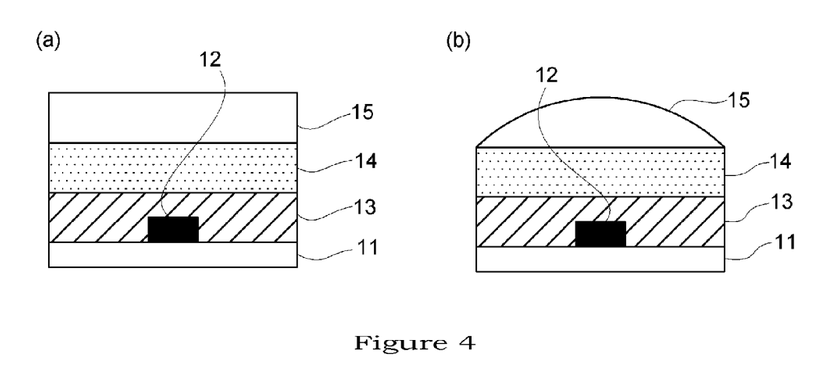
FIG. 4 shows schematic side views of embodiments of the LED devices of Example 12, illustrating LED devices having (a) three plane layers of encapsulant, and (b) two plane layers and one dome-shaped single layer of encapsulant, respectively.

FIG. 4 show schematic side views of still another embodiment of the LED device according to the present invention. This embodiment further includes a silicone layer 15 formed on a LED device having the same structure as the LED device described in Example 10 (a) and (b).

INDUSTRIAL APPLICABILITY

The present invention enables to provide a LED device with an encapsulant which is highly moisture resistant and substantially impermeable to moisture, stable against light and heat, and can be formed at lower range of temperatures. As it can be provided through an encapsulation process at lower temperatures, the LED device in which the encapsulant is employed has less risks of adverse influences of heat left on the chip or the substrate. And it can be widely used as it enables utilization of sulfide-based phosphors, which are vulnerable to moisture. Further, it uses as an encapsulant, a transparent amorphous solid comprising a metal oxide, a material with which higher refractive indexes than those of resins are easily available, the present invention is highly useful also in providing a LED device with increased output efficiency of light from the LED chip and thus having an advantage in preventing excess heating of the LED chip.

REFERENCE SIGNS LIST

1 LED chip
2 reflector
3 raw material composition
11 support
12 LED chip
13 encapsulant layer (light guiding layer)
14 encapsulant layer (color converting layer)
15 encapsulant layer (silicone layer)

The invention claimed is:

1. A chip-encapsulated LED device comprising an LED chip which is mounted on a support and electrically connected and an encapsulant encapsulating the LED chip, wherein the encapsulant is a transparent amorphous solid comprising a metal oxide, wherein the amorphous solid comprises ZrO as the major component.

2. The chip-encapsulated LED device according to claim 1, wherein the amorphous solid further comprises $SiO_2$ as a component.

3. The chip-encapsulated LED device according to claim 1, wherein the encapsulant encapsulates the LED chip adhering directly to the surface thereof.

4. The chip-encapsulated LED device according to claim 1, wherein the LED chip is indirectly encapsulated in the encapsulant in which the LED chip already encapsulated in other encapsulant is encapsulated.

5. The chip-encapsulated LED device according to claim 1, wherein the encapsulant contains particles of one or more inorganic phosphors dispersed therein.

6. The chip-encapsulated LED device according to claim 1, wherein the encapsulant comprises two layers consisting of a layer which is closer to the LED chip and a layer which is farther from the LED chip, wherein at least one of the two layers contains particles of one or more inorganic phosphors dispersed therein.

7. The chip-encapsulated LED device according to claim 6, wherein the particles of one or more inorganic phosphors comprise at least particles of a sulfide-based phosphor or particles of a silicate-based phosphor.

8. The chip-encapsulated LED device according to claim 5, wherein the particles of one or more inorganic phosphors comprise at least particles of a sulfide-based phosphor or particles of a silicate-based phosphor.

9. The chip-encapsulated LED device according to claim 1, wherein the LED chip is a gallium nitride-based LED chip.

10. A method of production of a LED device in which an LED chip is encapsulated in a transparent amorphous solid comprising a metal oxide, comprising providing a LED chip mounted on a substrate and electrically connected, applying a solution comprising a metal alkoxide to the chip to cover the chip and an adjacent area thereto with the solution, subjecting the solution to a heat treatment to convert the solution to a transparent amorphous solid, wherein the metal alkoxide comprises zirconium alkoxide, and wherein the amorphous solid comprises ZrO as the major component.

11. The method of production according to claim 10, wherein the metal alkoxide is represented by the formula $M(OR_1)_n$ (wherein M denotes a metal atom selected from the group consisting of Al, Mg, Zr, La, Ce, Y, Eu, and Sc; n denotes the valence of M, and $R_1$ denotes an alkyl group having 1-6 carbon atoms).

12. The method of production according to claim 11, wherein M is Zr.

13. The method of production according to claim 10, wherein the solution comprising a metal alkoxide contains an organic solvent.

14. The method of production according to claim 10, wherein the solution comprising a metal alkoxide contains an alkoxysilane represented by the formula $Si(OR_2)_4$ (wherein $R_2$ denotes an alkyl group having 1-5 carbon atoms).

15. The method of production according to claim 10, wherein the solution comprising a metal alkoxide contains silica particles having a mean particle size of less than 10 nm.

16. The method for production according to claim 10, wherein the heat treatment is carried out at 70 to 200° C. for 0.25 to 4 hours.

17. The method of production according to claim 10, wherein the solution comprising a metal alkoxide is applied directly to the surface of the chip.

18. The method of production according to claim 10, wherein the LED chip is encapsulated in advance in other encapsulant, and wherein the solution comprising a metal alkoxide is applied to this other encapsulant.

19. The method of production according to claim 10, wherein the solution comprising a metal alkoxide contains dispersed particles of one or more inorganic phosphors.

20. The method of production according to claim 10, wherein a process of application of the solution comprising a metal alkoxide and heat treatment thereof is performed at least two times, wherein in at least in one performance of the process, the solution comprising a metal alkoxide contains dispersed particles of one or more inorganic phosphors.

21. The method of production according to claim 10, wherein the LED chip is a gallium nitride-based LED chip.

* * * * *